(12) United States Patent
Hsu et al.

(10) Patent No.: US 7,732,346 B2
(45) Date of Patent: Jun. 8, 2010

(54) WET CLEANING PROCESS AND METHOD FOR FABRICATING SEMICONDUCTOR DEVICE USING THE SAME

(75) Inventors: Chien-En Hsu, Hsinchu County (TW); Chih-Nan Liang, Changhua County (TW); Po-Sheng Lee, Hsinchu County (TW)

(73) Assignee: United Mircoelectronics Corp., Hsinchu (TW)

( * ) Notice: Subject to any disclaimer, the term of this patent is extended or adjusted under 35 U.S.C. 154(b) by 0 days.

(21) Appl. No.: 11/679,677

(22) Filed: Feb. 27, 2007

(65) Prior Publication Data

US 2008/0203057 A1    Aug. 28, 2008

(51) Int. Cl.
*H01L 21/302* (2006.01)

(52) U.S. Cl. .................... 438/745; 438/750; 134/1.3

(58) Field of Classification Search ................. 438/745, 438/750, 752; 134/1.1, 1.2, 1, 1.3; 216/100
See application file for complete search history.

(56) References Cited

U.S. PATENT DOCUMENTS 5,175,124 A    12/1992    Winebarger

| 5,336,371 | A | * | 8/1994 | Chung et al. | 134/34 |
| 5,445,311 | A | * | 8/1995 | Trask et al. | 228/175 |
| 2003/0088995 | A1 | * | 5/2003 | Bergman et al. | 34/415 |
| 2003/0157806 | A1 | * | 8/2003 | Nagahara et al. | 438/694 |
| 2005/0133066 | A1 | * | 6/2005 | Takahashi | 134/25.4 |
| 2007/0068558 | A1 | * | 3/2007 | Papanu et al. | 134/29 |

FOREIGN PATENT DOCUMENTS

CN    1851050 A    10/2006

OTHER PUBLICATIONS

Chinese Examination Report of China Application No. 2007100863720, dated Jul. 24, 2009.

* cited by examiner

*Primary Examiner*—Lan Vinh
(74) *Attorney, Agent, or Firm*—J.C. Patents

(57) ABSTRACT

A wet cleaning process is provided. The wet cleaning process includes at least one first rinse process and a second rinse step. The first rinse step includes rinsing a substrate using deionized water containing $CO_2$, and then draining the water containing $CO_2$ to expose the substrate in an atmosphere of $CO_2$. The second rinse step includes rinsing the substrate using deionized water containing $CO_2$.

20 Claims, 6 Drawing Sheets

WET CLEANING PROCESS AND METHOD FOR FABRICATING SEMICONDUCTOR DEVICE USING THE SAME

BACKGROUND OF THE INVENTION

1. Field of the Invention

The present invention relates to a method for fabricating a semiconductor. More particularly, the present invention relates to a wet cleaning process and a method for fabricating a semiconductor device using the same.

2. Description of Related Art

Lithography process can be used for patterning various material layers or performing certain processes, such as ion implantation process, in a selected area, and which is a very important step in the fabricating process of semiconductor devices. According to a typical lithography process, a photoresist layer is first coated over a material layer. Some parts of the photoresist layer are then selectively irradiated during an exposure process. After that, parts of the photoresist layer are removed with developer so as to form a photoresist pattern. Those exposed parts with decomposition are removed by the developer if the photoresist layer is positive photoresist, and those unexposed parts without crosslink are removed by the developer if the photoresist layer is negative photoresist. After the photoresist pattern is formed, subsequent dielectric layer etching, metal layer etching, or ion implantation process etc can be performed with the photoresist pattern as a mask. The photoresist layer has to be removed by dry cleaning or wet cleaning after the subsequent etching or ion implantation process is completed. Usually, oxygen plasma is adopted in dry cleaning, and any organic solution or various acidic solutions can be used in wet cleaning. Thereafter, a cleaning process is performed to remove residual photoresist layer or impurities on the surface of the substrate.

Metal micro-corrosion may be caused, which is commonly known as pitting, while patterning a metal layer with foregoing conventional lithography or etching techniques, or if the metal layer is exposed while etching other insulation layers, especially when the material of the metal layer is aluminum or Al—Cu alloy.

A method for fabricating a semiconductor device is disclosed in U.S. Pat. No. 5,175,124, wherein carbonated water is used for rinsing a substrate after a photoresist layer is removed with an organic solution in order to reduce metal micro-corrosion.

In addition, a method for cleaning a semiconductor wafer is disclosed in U.S. Pat. No. 5,336,371, wherein metal micro-corrosion is reduced by introducing $CO_2$ into a rinsing tank and overflowing the water.

Even though the problem of metal micro-corrosion can be eased by the methods disclosed in foregoing two patents, which cannot be resolved.

SUMMARY OF THE INVENTION

Accordingly, the present invention is directed to provide a wet cleaning process for reducing metal micro-corrosion.

The present invention provides a fabricating method of a semiconductor device which can reduce metal micro-corrosion.

The present invention provides a wet cleaning process including at least one first rinse process. The first rinse process includes rinsing a substrate using deionized water containing $CO_2$, and then draining the deionized water containing $CO_2$ to expose the substrate in an atmosphere of $CO_2$.

According to the wet cleaning process in an embodiment of the present invention, the method for rinsing the substrate using deionized water containing $CO_2$ includes introducing deionized water and $CO_2$ constantly into a rinsing tank and allowing the deionized water to overflow.

According to the wet cleaning process in an embodiment of the present invention, the method for exposing the substrate in the atmosphere of $CO_2$ includes draining the deionized water in the rinsing tank but keeping introducing $CO_2$ into the rinsing tank.

According to the wet cleaning process in an embodiment of the present invention, the rinsing tank includes a quick dump rinsing (QDR) tank.

According to an embodiment of the present invention, the wet cleaning process further includes a second rinse process, and the second rinse process is to rinse the substrate using deionized water containing $CO_2$.

According to an embodiment of the present invention, the forgoing second rinse process and first rinse process are performed in the same rinsing tank, and the second rinse process is to rinse the substrate using overflowed deionized water containing $CO_2$.

According to an embodiment of the present invention, the wet cleaning process further includes a third rinse process, and the third rinse process is to rinse the substrate using deionized water.

According to the wet cleaning process in an embodiment of the present invention, the third rinse process is performed in a rinsing tank to rinse the substrate using overflowed deionized water.

According to the wet cleaning process in an embodiment of the present invention, a metal material layer is disposed on the substrate.

According to the wet cleaning process in an embodiment of the present invention, the metal material includes aluminum or Al—Cu alloy.

According to the wet cleaning process in an embodiment of the present invention, an anti-reflection layer is disposed on the metal material layer.

The present invention provides a method for fabricating a semiconductor device. First, a substrate having a metal layer thereon is provided. A photoresist layer is then formed above the metal layer. Next, an etching process is performed to the metal layer with the photoresist layer as an etching mask. After that, the photoresist layer is removed by using a dry strip process. Polymer byproducts and impurities formed in the etching-process are removed by using an organic solution or an alkaline solution. Next, at least one first rinse process is performed, which includes rinsing the substrate using deionized water containing $CO_2$, and draining the deionized water containing $CO_2$ to expose the substrate in an atmosphere of $CO_2$.

According to an embodiment of the present invention, the semiconductor device fabricating method further includes a second rinse process after the first rinse process, and the second rinse process is to rinse the substrate using deionized water containing $CO_2$.

According to the semiconductor device fabricating method in an embodiment of the present invention, the second rinse process and the first rinse process are performed in the same rinsing tank, and the second rinse process is to rinse the substrate using overflowed deionized water containing $CO_2$.

According to an embodiment of the present invention, the semiconductor device fabricating method further includes a third rinse process after the second rinse process, and the third rinse process is to rinse the substrate using deionized water.

According to the semiconductor device fabricating method in an embodiment of the present invention, the etching process is performed to etch the metal layer so as to form a metal line.

According to an embodiment of the present invention, the semiconductor device fabricating method further includes forming an insulation layer between the metal layer and the photoresist layer, and the etching process further includes etching the insulation layer to form an opening for exposing the metal layer.

According to the semiconductor device fabricating method in an embodiment of the present invention, the insulation layer is an inter-metal dielectric layer, and the opening includes a via opening.

According to the semiconductor device fabricating method in an embodiment of the present invention, the insulation layer is an inter-metal dielectric layer, and the opening includes a dual metal damascene opening.

According to the semiconductor device fabricating method in an embodiment of the present invention, the insulation layer is a passivation layer, and the opening is a solder pad opening.

According to the semiconductor device fabricating method in an embodiment of the present invention, an anti-reflection layer is further formed on the metal layer before forming the photoresist layer.

According to the present invention, metal micro-corrosion can be effectively reduced to an acceptable range.

In order to make the aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Embodiment One

Figure 1:
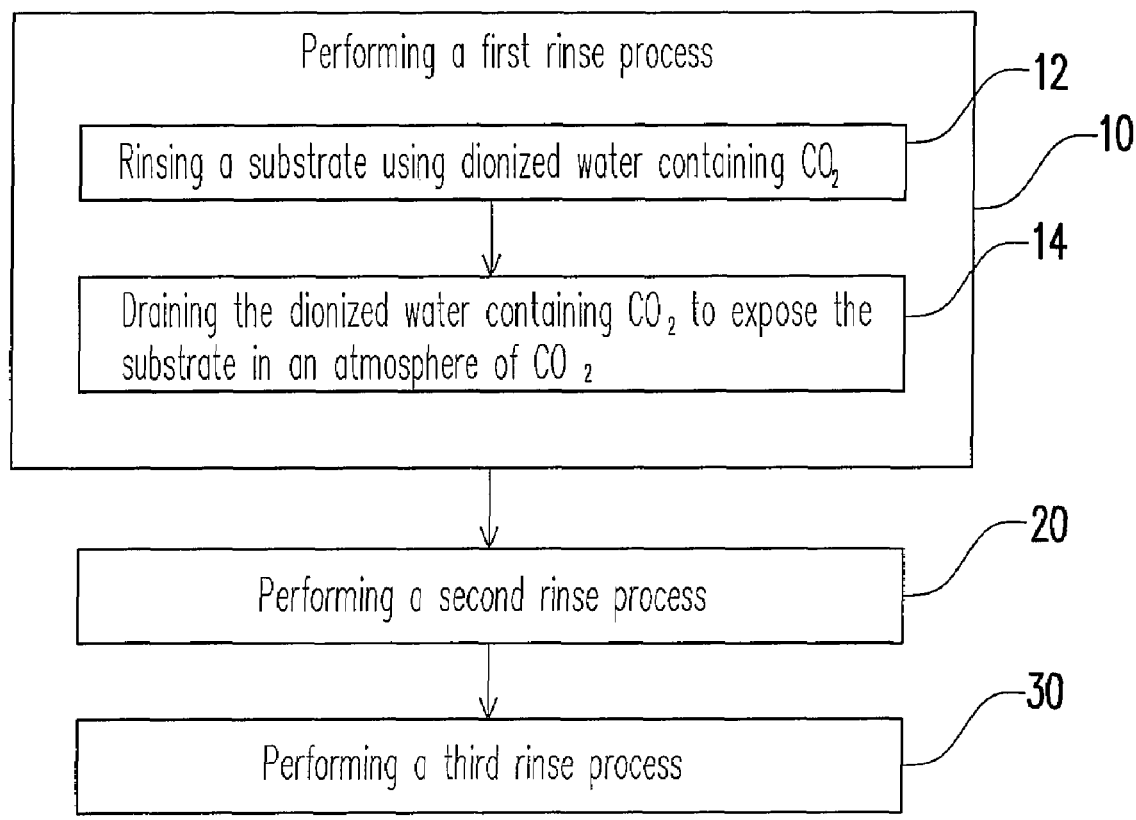
FIG. 1 is a flowchart of a wet cleaning process according to a first embodiment of the present invention.

FIG. 1 is a flowchart of a wet cleaning process according to a first embodiment of the present invention.

Referring to FIG. 1, the wet cleaning process in the present invention is suitable for a substrate having a metal material layer thereon. The material of the metal material layer is a corrodible material such as aluminum or Al—Cu alloy. Besides, an anti-reflection layer may be further formed on the metal material layer, and the material of the anti-reflection layer may be Ti, Ta, TiN, TaN, SiON or a combination thereof. The metal material layer is exposed during the etching process, and the photoresist layer above the metal material layer has been removed. Polymer byproducts and impurities formed in the etching process may be removed with alkaline solution such as amine solution, and then the residual amine on the surface of the substrate is removed with organic solvent, such as N-methyl pyrrolidone (NMP) or isopropanol.

The cleaning method includes performing at least one first rinse step 10 to remove organic solvent or amine on the surface of the substrate. The first rinse step 10 includes step 12 and step 14. Step 12 is to rinse the substrate using a deionized water containing $CO_2$. Step 14 is to drain the deionized water containing $CO_2$ in step 12 to expose the substrate in an atmosphere of $CO_2$.

The first rinse step 10 may be performed in a rinsing tank. The rinsing tank may be a quick dump rinsing (QDR) tank. While performing the step 12, deionized water and $CO_2$ are introduced into the rinsing tank constantly and the deionized water is allowed to overflow. The duration of the step 12 may be between 5 and 90 seconds. The flow rate of $CO_2$ may be between 3 and 20 l/min.

While performing step 14, the deionized water in the rinsing tank used in step 12 is drained but $CO_2$ is still being introduced into the rinsing tank in order to expose the substrate in an atmosphere of $CO_2$. The flow rate of $CO_2$ in step 14 may be between 3 and 20 l/mn, and the introducing time may be between 5 and 120 seconds.

In an embodiment of the present invention, by rinsing the substrate in deionized water containing $CO_2$ as in step 12, organic solvent or amine on the surface of the substrate can be removed and metal micro-corrosion can be reduced. While in step 14, deionized water in the rinsing tank is drained but $CO_2$ is kept introducing into the rinsing tank in order to expose the substrate in an atmosphere of $CO_2$ and to prevent the substrate from being exposed in air. It is proved by experiments that metal micro-corrosion can be effectively reduced by preventing the substrate from being exposed in air during the first rinse step 10, which may be because $CO_2$ can inactivate the alkaline solution or organic solvent on the substrate.

In embodiments of the present invention, the times of the first rinse step 10 are to be performed is determined according to actual requirement. In an embodiment of the present invention, the first rinse step 10 is performed between 1 and 7 times. The substrate cannot be thoroughly cleaned if too few number of the first rinse step 10 is performed. While metal micro-corrosion will be increased if the first rinse step 10 is performed too many times.

In an embodiment of the present invention, the wet cleaning process further includes a second rinse step 20, wherein deionized water and $CO_2$ are introduced into the rinsing tank constantly and the deionized water is allowed to overflow. The flow rate of $CO_2$ introduced in the rinsing tank in the second rinse step 20 may be between 3 and 20 l/min, the process duration may be between 3 and 120 seconds. The same rinsing tank may be used in the second rinse step 20 as in the first rinse step 10, and which may be a QDR tank.

In an embodiment of the present invention, the wet cleaning process further includes a third rinse step 30, wherein the substrate is rinsed using deionized water. The third rinse step 30 may be performed in a rinsing tank, and the substrate may be rinsed using overflowed deionized water. Whether the substrate is up to a desired clean standard may be determined while performing the third rinse step 30.

The cleaning method in the present invention can be applied to various semiconductor processes, and several embodiments of the present invention will be described below.

Embodiment Two

Figure 2A:
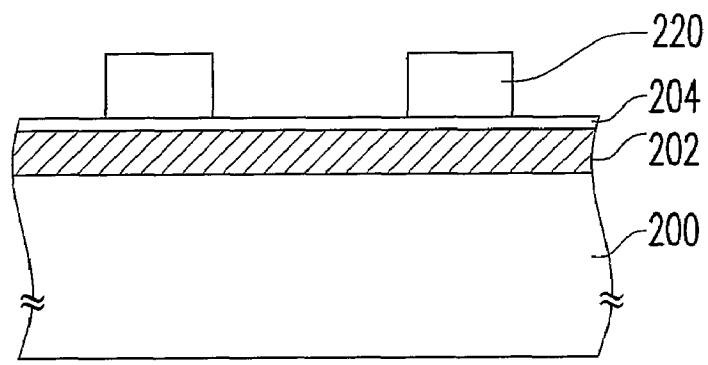
FIGS. 2A~2C are cross-sectional views illustrating a method for fabricating a metal line according to a second embodiment of the present invention.
Figure 2B:
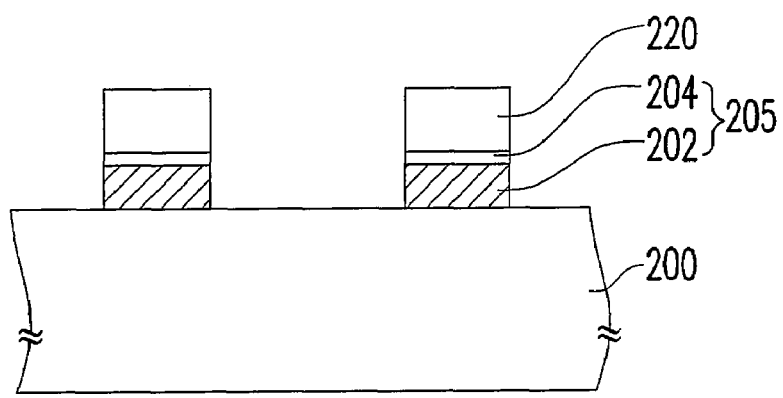
Figure 2C:
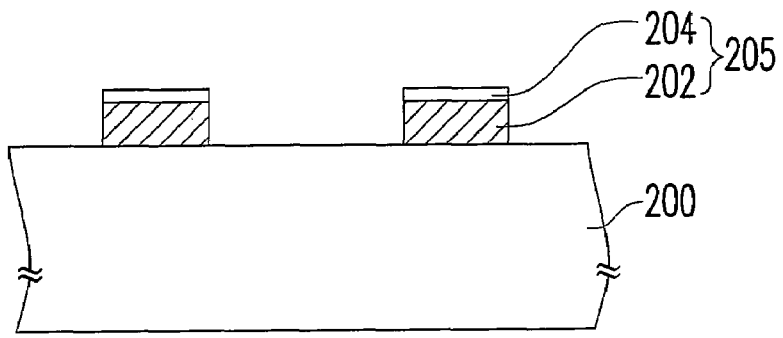

FIGS. 2A~2C are cross-sectional views illustrating a method for fabricating a metal line according to a second embodiment of the present invention.

Referring to FIG. 2A, a metal layer 202 is formed above a substrate 200, wherein the material of the metal layer 202 is a corrodible material such as aluminum or Al—Cu alloy. In an embodiment of the present invention, an anti-reflection layer 204 is further formed on the metal layer 202, and the material of the anti-reflection layer 204 may be Ti, Ta, TiN, TaN, SiON and a combination thereof. Thereafter, a lithography process is performed to forming a photoresist pattern 220 on the anti-reflection layer 204.

Next, referring to FIG. 2B, an anisotropic etching process is performed with the photoresist pattern 220 as a mask in order to pattern the anti-reflection layer 204 and the metal layer 202, so as to form a metal line 205.

After that, referring to FIG. 2C, the photoresist pattern 220 is removed, and a rinse process is performed to remove residual alkaline solution or organic solution. The method in the first embodiment described above may be adopted in the rinse process for preventing the sidewall of the metal line 205 from being corroded into holes. Thereafter, the substrate 200 is dried, and which may be performed by using isopropanol.

Embodiment Three

Figure 3A:
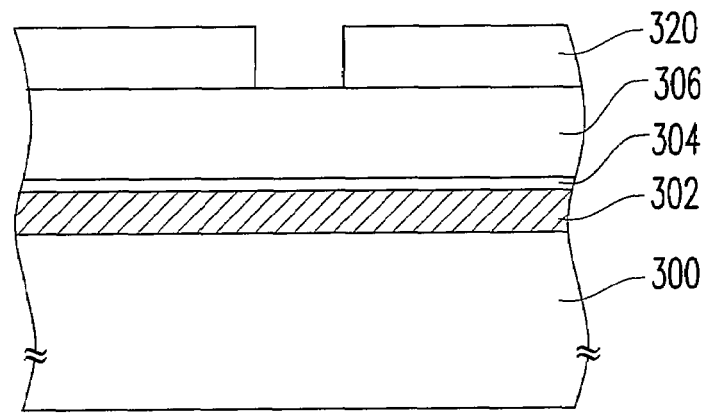
FIGS. 3A~3C are cross-sectional views illustrating a method for fabricating a via opening according to a third embodiment of the present invention.
Figure 3B:
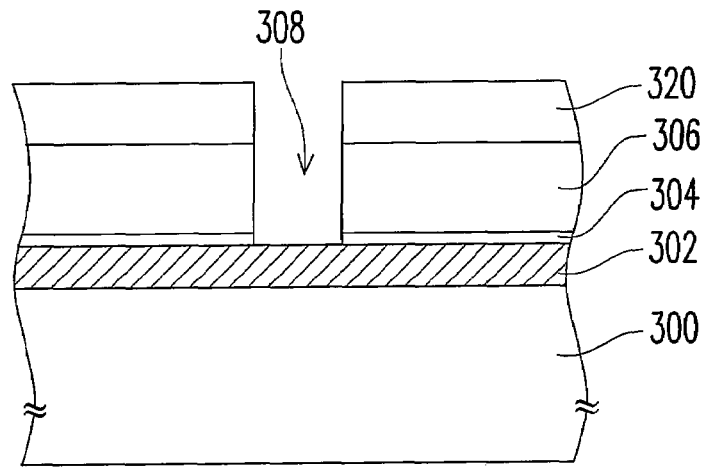
Figure 3C:
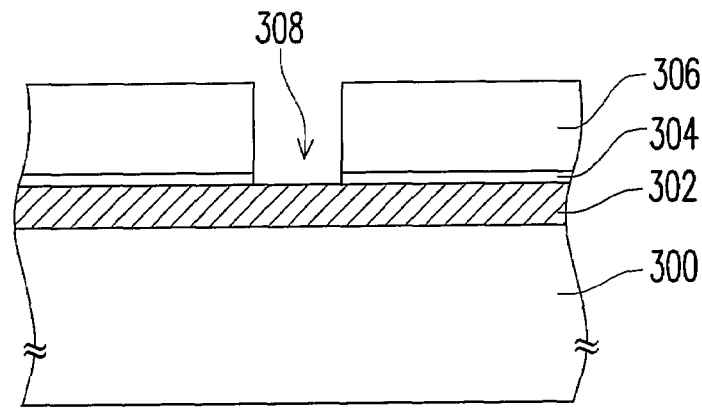

FIGS. 3A~3C are cross-sectional views illustrating a method for fabricating a via opening according to a third embodiment of the present invention.

Referring to FIG. 3A, a substrate 300 having been formed with a metal layer 302 thereon is provided. The material of the metal layer 302 is a corrodible material such as aluminum or Al—Cu alloy. In an embodiment of the present invention, an anti-reflection layer 304 is further formed on the metal layer 302, and the material thereof may be Ti, Ta, TiN, TaN, or a combination thereof. Next, a dielectric layer 306 is formed on the anti-reflection layer 304, and the material thereof may be silicon oxide or a material having its dielectric constant lower than 4. After that, a lithography process is performed to form a photoresist pattern 320 on the dielectric layer 306.

Next, referring to FIG. 3B, an anisotropic etching process is performed with the photoresist pattern 320 as a mask to etch the dielectric layer 306 and etch through the anti-reflection layer 304, so as to form a via opening 308 for exposing the metal layer 302.

After that, referring to FIG. 3C, the photoresist pattern 320 is removed, and a rinse process is then performed to remove residual alkaline solution or organic solution. The method in the first embodiment described above may be adopted in the rinse process for preventing the exposed surface of the metal layer 302 from being corroded into holes. Thereafter, the substrate 300 is dried, and which may be performed by using isopropanol.

Embodiment Four

FIGS. 4A~4D are cross-sectional views illustrating a method for fabricating a dual metal damascene opening according to a fourth embodiment of the present invention.

Figure 4A:
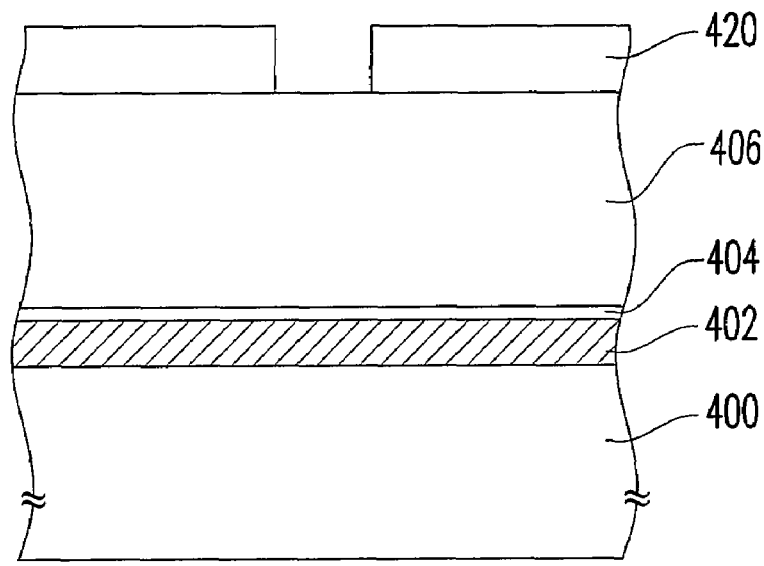
FIGS. 4A~4D are cross-sectional views illustrating a method for fabricating a dual metal damascene opening according to a fourth embodiment of the present invention.

Referring to FIG. 4A, a substrate 400 having been formed with a metal layer 402 thereon is provided. The material of the metal layer 402 is a corrodible material such as aluminum or Al—Cu alloy. In an embodiment of the present invention, an anti-reflection layer 404 is further formed on the metal layer 402, and the material thereof may be Ti, Ta, TiN, TaN, or a combination thereof. Next, a dielectric layer 406 is formed on the anti-reflection layer 404, and the material thereof may be silicon oxide or a material having its dielectric constant lower than 4. After that, a lithography process is performed to forming a photoresist pattern 420 on the dielectric layer 406.

Figure 4B:
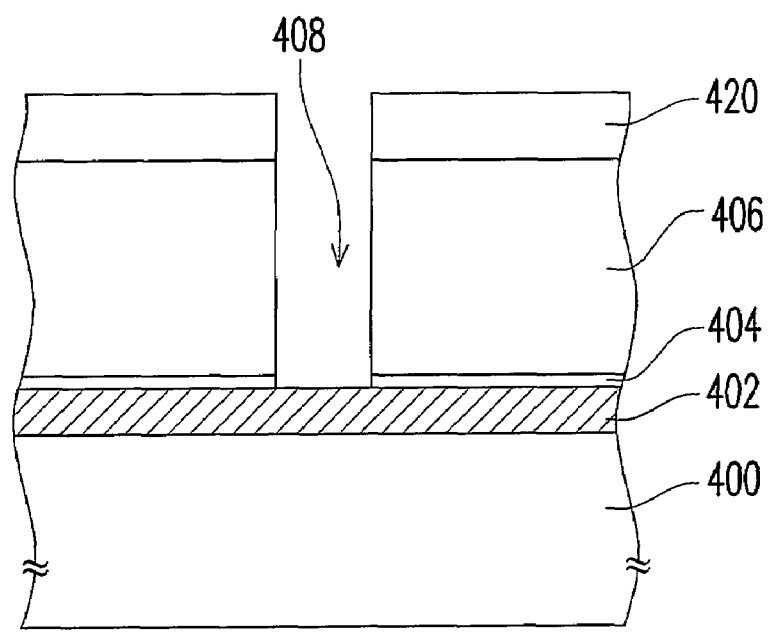

Next, referring to FIG. 4B, an anisotropic etching process is performed with the photoresist pattern 420 as a mask to etch the dielectric layer 406 and etch through the anti-reflection layer 404, so as to form a via opening 408 for exposing the metal layer 402.

Figure 4C:
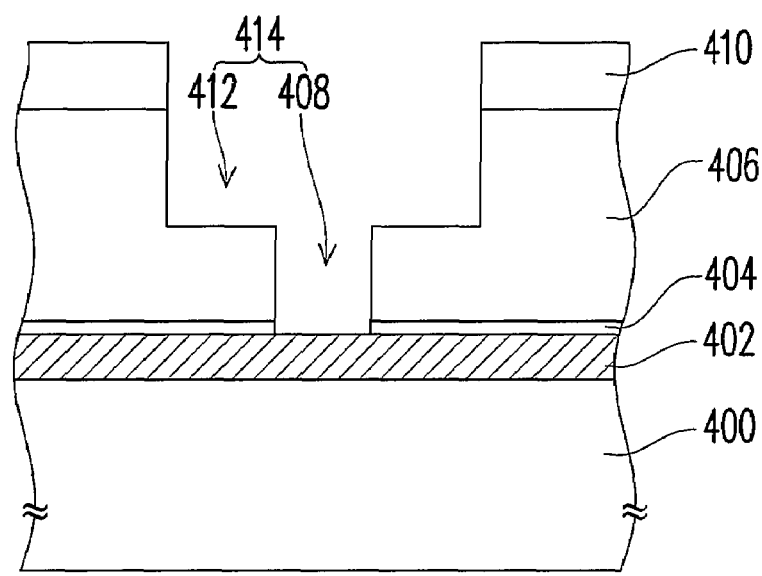

After that, referring to FIG. 4C, the photoresist pattern 420 is removed, and then a rinse process is performed to remove residual alkaline solution or organic solution. The method in the first embodiment described above may be adopted in the rinse process for preventing the exposed surface of the metal layer 402 from being corroded into holes.

Thereafter, referring to FIG. 4C, another photoresist layer 410 is formed on the dielectric layer 406, and which is used as a mask for etching the dielectric layer 406 in order to form a trench 412 connected to the via opening 408 in the dielectric layer 406. The trench 412 and the via opening 408 form a dual metal damascene opening 414.

Figure 4D:
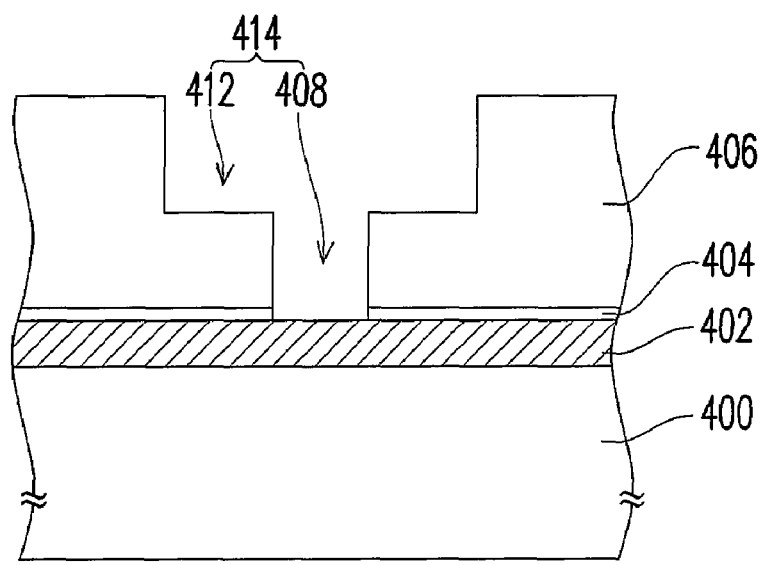

Next, referring to FIG. 4D, the photoresist pattern 410 is removed, and a rinse process is then performed to remove residual alkaline solution or organic solution. The method in the first embodiment described above may be adopted in the rinse process for preventing the exposed surface of the metal layer 402 from being corroded into holes. Thereafter, the substrate 400 is dried, and which may be performed by using isopropanol.

In foregoing embodiment, the via opening is formed first and then the trench is formed. However, the trench may also be formed before the via opening. The method in the first embodiment described above can be used for cleaning as long as the metal layer has been exposed when the photoresist pattern is removed, so that the exposed surface of the metal layer can be prevented from being corroded into holes.

Embodiment Five

Figure 5A:
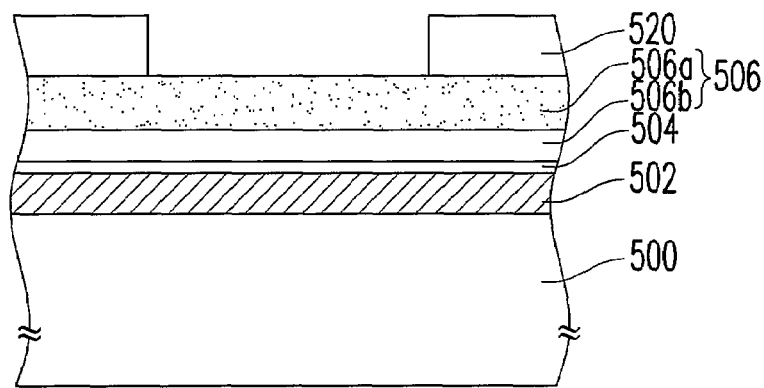
FIGS. 5A~5C are cross-sectional views illustrating a method for fabricating a solder pad opening according to a fifth embodiment of the present invention.
Figure 5B:
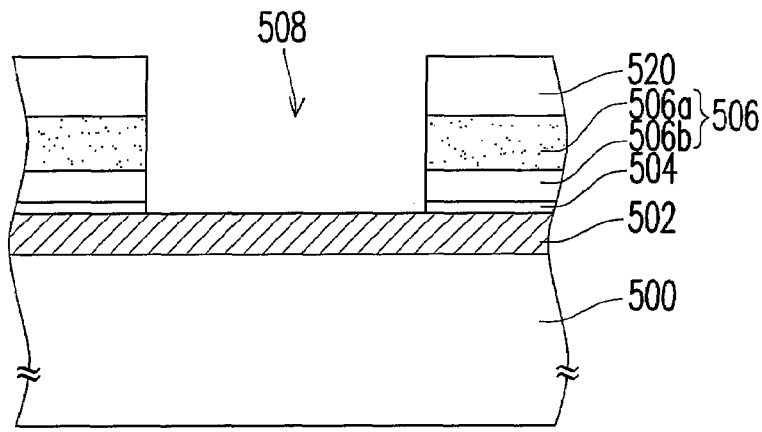
Figure 5C:
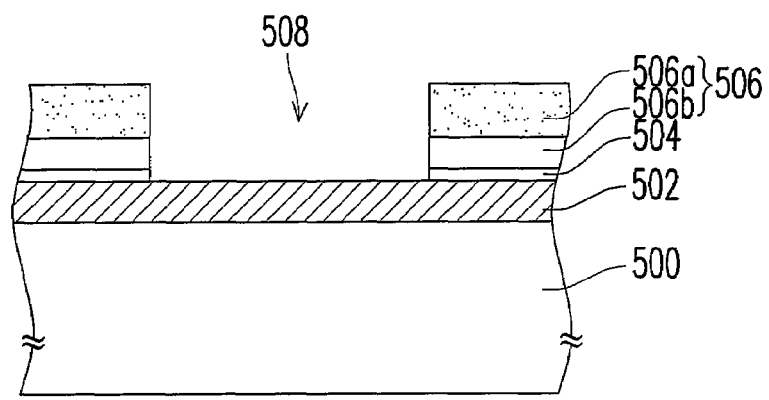

FIGS. 5A~5C are cross-sectional views illustrating a method for fabricating a solder pad opening according to a fifth embodiment of the present invention.

Referring to FIG. 5A, a substrate 500 having been formed with a metal layer 502 thereon is provided. The material of the metal layer 502 is a corrodible material such as aluminum or Al—Cu alloy. In an embodiment of the present invention, an anti-reflection layer 504 is further formed on the metal layer 502, and the material thereof may be Ti, Ta, TiN, TaN, or a combination thereof. Next, a passivation layer 506 is formed on the anti-reflection layer 504. The passivation layer 506 may be formed by a silicon oxide layer 506a and a silicon nitride layer 506b. Thereafter, a photoresist pattern 520 is formed on the passivation layer 506 through a lithography process.

Next, referring to FIG. 5B, an anisotropic etching process is performed with the photoresist pattern 520 as a mask to etch the passivation layer 506 and etch through the anti-reflection layer 504, so as to form a solder pad opening 508 for exposing the metal layer 502.

After that, referring to FIG. 5C, the photoresist pattern 520 is removed, and a rinse process is then performed to remove residual alkaline solution or organic solution. The method in the first embodiment described above may be adopted in the rinse process for preventing the exposed surface of the metal layer 502 from being corroded into holes. Thereafter, the substrate 500 is dried, and which may be performed by using isopropanol.

Example

A cleaning process is performed to a substrate having an Al—Cu metal line in the sequence of steps 1~8 as shown in table 1. In step 1, the substrate is rinsed using deionized water containing $CO_2$ in a QDR tank, and then in step 2, the deionized water containing $CO_2$ is drained from the QDR tank but $CO_2$ is still kept introducing into the tank so that the substrate is exposed in an atmosphere of $CO_2$. Next, steps 3~6 are performed, wherein steps 3 and 5 are the same as step 1 but with different durations, and steps 4 and 6 are the same as step 2 but with slightly different durations. In steps 7 and 8, the substrate is rinsed in the same QDR tank using deionized water containing $CO_2$. The experiment result shows that about 10 holes are corroded in the substrate, and the diameters of the holes are less than 0.3 µm.

TABLE 1

| Step | Time (seconds) | Supplying Deionized Water | Draining Deionized Water | Supplying $CO_2$ |
| --- | --- | --- | --- | --- |
| 1 | 10 | O | | O |
| 2 | 9 | | O | O |
| 3 | 70 | O | | O |
| 4 | 8 | | O | O |
| 5 | 70 | O | | O |
| 6 | 8 | | O | O |
| 7 | 45 | O | | O |
| 8 | 60 | O | | O |

Comparison Example

A cleaning process is performed to the substrate having an Al—Cu metal line in the sequence of steps 1~8 as shown in table 2. The comparison example is similar to the foregoing example. However, while performing steps 2, 4, and 6, only the deionized water containing $CO_2$ is drained from the QDR tank to expose the substrate in air but no $CO_2$ is introduced into the tank anymore. Besides, while performing steps 7 and 8, the substrate is only rinsed using deionized water without $CO_2$. The experiment result shows that about 50 holes are corroded in the substrate, and the diameters of the holes are about 0.8 µm.

TABLE 2

| Step | Time (seconds) | Supplying Deionized Water | Draining Deionized Water | Supplying $CO_2$ |
| --- | --- | --- | --- | --- |
| 1 | 10 | O | | O |
| 2 | 9 | | O | |
| 3 | 70 | O | | O |
| 4 | 8 | | O | |
| 5 | 70 | O | | O |
| 6 | 8 | | O | |
| 7 | 45 | O | | |
| 8 | 60 | O | | |

It can be understood by comparing foregoing experiment results that corrosion holes can be further reduced by introducing $CO_2$ into the rinsing tank while draining deionized water out of the tank after rinsing the substrate using the deionized water containing $CO_2$.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A wet cleaning process, comprising:
   performing at least one first rinse process, the first rinse process comprising:
   rinsing a substrate using deionized water in a rinsing tank and concurrently supplying CO2 to the rinsing tank, wherein the deionized water and the $CO_2$ are constantly introduced into the rinsing tank and, at the same time, the deionized water is allowed to overflow the rinsing tank, and for submerging the substrate therein; and
   draining the deionized water used for the rinsing and the submerging of the substrate in the previous rinsing step while maintaining the supply of the CO2 to the rinsing tank to expose the substrate in an atmosphere of CO2, wherein the deionized water is not being introduced into the tank during the step of draining the deionized water.

2. The wet cleaning process as claimed in claim 1, wherein the rinsing tank comprises a quick dump rinsing (QDR) tank.

3. The wet cleaning process as claimed in claim 1, wherein a metal material layer is disposed on the substrate.

4. The wet cleaning process as claimed in claim 3, wherein the material of the metal material layer comprises aluminum or Al—Cu alloy.

5. The wet cleaning process as claimed in claim 3, wherein an anti-reflection layer is disposed on the metal material layer.

6. The wet cleaning process as claimed in claim 1 further comprising performing a second rinse process after the first rinse process, wherein the second rinse process is to rinse the substrate using deionized water containing $CO_2$.

7. The wet cleaning process as claimed in claim 6, wherein the second rinse process and the first rinse process are performed in the same rinsing tank, and the second rinse process is to rinse the substrate using overflowed deionized water containing $CO_2$.

8. The wet cleaning process as claimed in claim 7, wherein the rinsing tank for performing the second rinse process and the first rinse process is a QDR tank.

9. The wet cleaning process as claimed in claim 8 further comprising performing a third rinse process after the second rinse process, wherein the third rinse process is to rinse the substrate using deionized water.

10. The wet cleaning process as claimed in claim 9, wherein the third rinse process is performed in a rinsing tank, and is to rinse the substrate using overflowed deionized water.

11. A method for fabricating a semiconductor device, comprising:
    providing a substrate having a metal layer thereon;
    forming a photoresist layer above the metal layer;
    performing an etching process with the photoresist layer as an etching mask in order to etch the metal layer;
    removing the photoresist layer using an organic solution or an alkaline solution; and
    performing at least one first rinse process, comprising:
    rinsing a substrate using deionized water containing $CO_2$ in a rinsing tank and concurrently supplying $CO_2$ to the rinsing tank, wherein the deionized water and the $CO_2$ are constantly introduced into the rinsing tank and, at the same time, the deionized water is allowed to overflow the rinsing tank, and for submerging the substrate therein; and draining the deionized water used for the rinsing and the submerging of the substrate in the previous rinsing step while maintaining the supply of the $CO_2$ to the rinsing tank to expose the substrate in an atmosphere of $CO_2$, wherein the deionized water is not being introduced into the tank during the step of draining the deionized water.

12. The fabricating method as claimed in claim 11, wherein the etching process is performed for etching the metal layer, so as to form a metal line.

13. The fabricating method as claimed in claim 11, wherein an anti-reflection layer is further formed on the metal layer before forming the photoresist layer.

14. The fabricating method as claimed in claim 11 further comprising performing a second rinse process after the first rinse process, wherein the second rinse process is to rinse the substrate using deionized water containing $CO_2$.

15. The fabricating method as claimed in claim 14, wherein the second rinse process and the first rinse process are performed in the same rinsing tank, and the second rinse process is to rinse the substrate using overflowed deionized water containing $CO_2$.

16. The fabricating method as claimed in claim 15 further comprising performing a third rinse process after the second rinse process, wherein the third rinse process is to rinse the substrate using deionized water.

17. The fabricating method as claimed in claim 11 further comprising forming an insulation layer between the metal layer and the photoresist layer, and the etching process further comprising etching the insulation layer to form an opening for exposing the metal layer.

18. The fabricating method as claimed in claim 17, wherein the insulation layer is an inter-metal dielectric layer, and the opening comprises a via opening.

19. The fabricating method as claimed in claim 17, wherein the insulation layer is an inter-metal dielectric layer, and the opening comprises a dual metal damascene opening.

20. The fabricating method as claimed in claim 17, wherein the insulation layer is a passivation layer, and the opening is a solder pad opening.

* * * * *

UNITED STATES PATENT AND TRADEMARK OFFICE
CERTIFICATE OF CORRECTION

| | | |
|---|---|---|
| PATENT NO. | : 7,732,346 B2 | |
| APPLICATION NO. | : 11/679677 | |
| DATED | : June 8, 2010 | |
| INVENTOR(S) | : Chien-En Hsu et al. | |

It is certified that error appears in the above-identified patent and that said Letters Patent is hereby corrected as shown below:

On the title page:
    Please replace item (73) Assignee's name from "United Mircoelectronics Corp." to --United Microelectronics Corp.--

Signed and Sealed this

Twenty-seventh Day of September, 2011

David J. Kappos
*Director of the United States Patent and Trademark Office*